United States Patent [19]

Matsuoka

[11] Patent Number: 5,364,286
[45] Date of Patent: Nov. 15, 1994

[54] CONTACTING CONDITION MAINTAINING DEVICE FOR USE IN AN ELECTRIC PART SOCKET

[75] Inventor: Noriyuki Matsuoka, Yokohama, Japan

[73] Assignee: Yamaichi Electronics Co., Ltd., Tokyo, Japan

[21] Appl. No.: 54,031

[22] Filed: Apr. 29, 1993

[30] Foreign Application Priority Data

May 1, 1992 [JP] Japan .................................. 4-139974

[51] Int. Cl.⁵ .............................................. H01R 13/62
[52] U.S. Cl. ...................................... 439/330; 439/70; 439/331
[58] Field of Search ........................ 439/259, 261–268, 439/73, 330, 331, 70

[56] References Cited

U.S. PATENT DOCUMENTS

| | | | |
|---|---|---|---|
| 4,359,252 | 11/1982 | Olsson et al. | 439/71 |
| 4,378,139 | 3/1983 | Griffin et al. | 439/331 |
| 4,456,318 | 6/1984 | Shibata et al. | 439/68 |
| 4,553,805 | 11/1985 | Aikens | 439/325 |
| 5,020,998 | 6/1991 | Ikeya et al. | 439/266 |
| 5,186,642 | 2/1993 | Matsuoka et al. | 439/268 |

FOREIGN PATENT DOCUMENTS 60-57135  4/1985  Japan .

*Primary Examiner*—Larry I. Schwartz
*Assistant Examiner*—Hien D. Vu
*Attorney, Agent, or Firm*—Wenderoth, Lind & Ponack

[57] ABSTRACT

An electric part socket includes a socket having a plurality of contacts. An electric part having a plurality of terminals can be placed on the socket such that the terminals are brought into contact with the contacts respectively when a press-down force is applied to a body of the electric part. A contacting condition maintaining device for use in the electric part socket comprises a mechanism for pressing down the electric part body, including pressing levers provided at each of at least two opposite sides of the electric part body such that they are pivotable upwardly and downwardly along the opposite sides, latches corresponding to the pressing levers and each engageable with an edge portion of the electric part body when the pressing levers are pivoted downwardly so as to press down the electric part body, and lock members corresponding to the pressing levers and adapted to prohibit the pressing levers from being pivoted upwardly when the pressing levers are pivoted downwardly, so as to cause the latches to maintain condition in which they press down on the electric part body.

19 Claims, 7 Drawing Sheets

CONTACTING CONDITION MAINTAINING DEVICE FOR USE IN AN ELECTRIC PART SOCKET

BACKGROUND OF THE INVENTION

This invention relates to a socket for an electric part in which a press-down force is applied to an electric part body placed on a socket body, and more particularly to an electric part press-down device for maintaining a contacting condition between the electric part and the socket body.

Japanese Laid-Open Utility Model Publication No. Sho 60-57135, for example, discloses a typical electric part socket in which a press-down force is applied to an electric part placed on a socket body. In this conventional electric part socket, a basal end of a pressing cover is pivotally attached to one end of the socket body, an electric part body (or terminals) is pressed down by closing the pressing cover onto an upper surface of the socket body and thereby flexing contacts of the socket body downwardly and obtaining a contacting pressure against the terminals due to the reaction force of the contacts. A lock lever pivotably attached to the other end of the socket body is brought into engagement with a free end of the pressing cover to maintain the closing condition and thus to maintain the contacting condition.

However, in the socket thus constructed, the socket body and the pressing cover are generally the same in size, and when the pressing cover is closed onto the upper surface of the socket body, the electric part is almost entirely covered with the pressing cover and held in a half closed condition between the pressing cover and the socket body. As a result, heat of the electric part cannot be effectively radiated, and therefore the electric part is damaged by accumulated heat.

When the electric part is placed on and removed from the socket body, it is necessary to pivot the pressing cover by more than 90 degrees in order to open the upper surface of the socket body and, therefore, it becomes difficult to use an automated machine to open and close the pressing cover.

Since an upwardly directed force acts on a central portion of the pressing cover due to the reaction force of the contacts, the pressing cover becomes warped in a short period of time due to heat.

Also, pivot end and the free end of the pressing cover do not press down against the electric part simultaneously (i.e. the electric part is pressed against first by the pivot end of the pressing cover), the electric part is caused to jump, thereby giving rise to poor contact between the terminals and the contacts.

SUMMARY OF THE INVENTION

It is therefore a general object of the present invention to provide a contacting condition maintaining device for use in an electric part socket capable of solving the above-mentioned problems inherent in the prior art device.

According to one aspect of the present invention, an electric part socket includes a socket having a plurality of contacts, and receives in the socket an electric part having a plurality of terminals, the terminals being brought into contact with the contacts respectively when a press-down force is applied to a body of the electric part. The electric part socket includes a contacting condition maintaining device, which also acts as a means for pressing down the electric part body, comprises pressing levers provided on each of at least two opposite sides of the electric part body. The pressing levers are pivotable upwardly and downwardly along the opposite sides. Latches are provided which correspond to the pressing levers and are engageable with edge portions of the electric part body when the pressing levers are pivoted downwardly, so as to press the electric part body down. Lock members are provided which correspond to the pressing levers and are adapted to prevent the pressing levers from being pivoted upwardly after the pressing levers have been pivoted downwardly, so as to maintain the latches in a position in which they press the electric part body down.

In another aspect of the present invention, an electric part socket includes a socket having a plurality of contacts and receives in the sockets an electric part having a plurality of terminals, the terminals being brought into contact with the contacts respectively when a press-down force is applied to a body of the electric part. The electric part socket includes a contacting condition maintaining device, which also acts as a means for pressing down the electric part body, comprises pressing levers provided on each of at least two opposite sides of the electric part body. The pressing levers are pivotable upwardly and downwardly along the opposite sides. Latches are provided which correspond to the pressing levers and are engageable with edge portions of the electric part body when the pressing levers are pivoted downwardly, so as to press the electric part body down. Lock members are provided which correspond to the pressing levers and are adapted to prevent the pressing levers from being pivoted upwardly after they have been pivoted downwardly, so as to maintain the latches in a position in which they press the electric part body down. An actuator is mounted on an upper part of the socket body for movement upwardly and downwardly and is adapted to press down the pressing levers when moved downwardly.

In a further aspect of the present invention, an electric part socket includes a socket having a plurality of contacts, and receives in the socket an electric part having a plurality of terminals, the terminals being brought into contact with the contacts respectively when a press-down force is applied to a body of the electric part. The electric part socket includes a contacting condition maintaining device, which also acts as a means for pressing the electric part body down, comprises pressing levers provided on each of at least two opposite sides of the electric part body. The levers are pivotable upwardly and downwardly along the opposite sides. Latches are provided which correspond to the pressing levers and are engageable with edge portions of the electric part body when the pressing levers are pivoted downwardly, so as to press the electric part body down. Lock members are provided which correspond to the pressing levers and are adapted to prevent the pressing levers from being pivoted upwardly after having been pivoted downwardly, so as to maintain the latches in a position in which they press the electric part body down. A first actuator is mounted on an upper part of the socket body for movement upwardly and downwardly and is adapted to press down the pressing levers when moved downwardly, and a second actuator is mounted on an upper part of the socket body for movement upwardly and downwardly and is adapted to move the lock members to unlocking positions, respectively.

DETAILED DESCRIPTION OF THE EMBODIMENTS

A basic construction of the present invention will be described first, with reference to embodiments of FIGS. 14 and 15.

Figure 14:
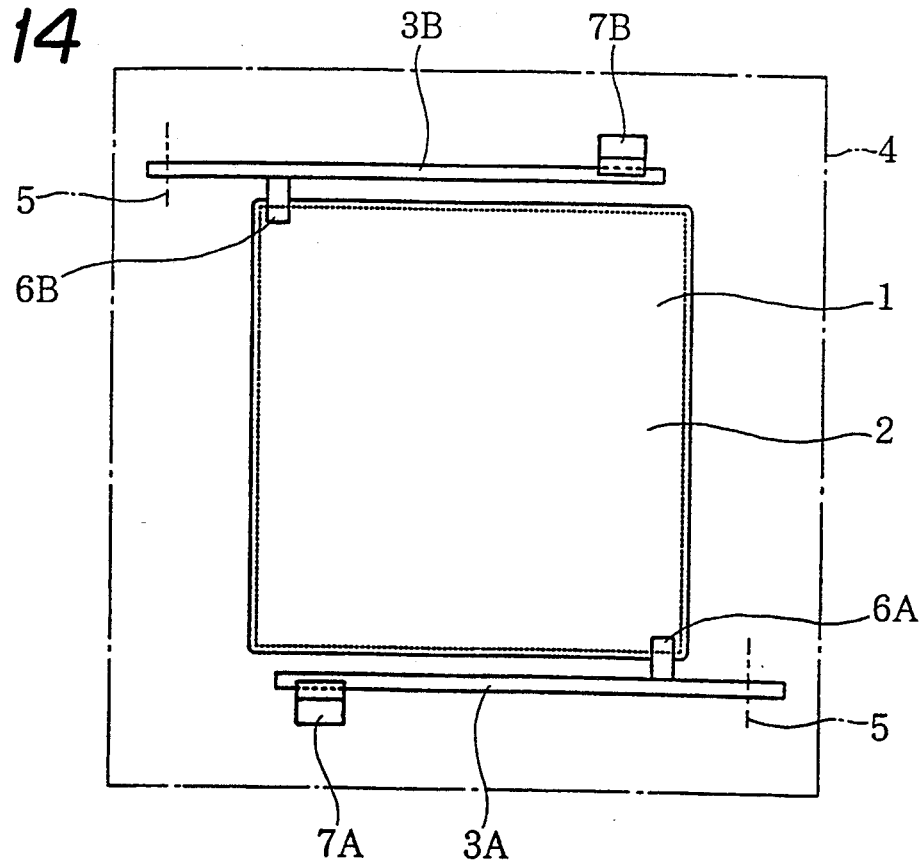
FIG. 14 is a plan view of an important portion of an electric part socket of the present invention, showing a basic construction thereof.
Figure 15:
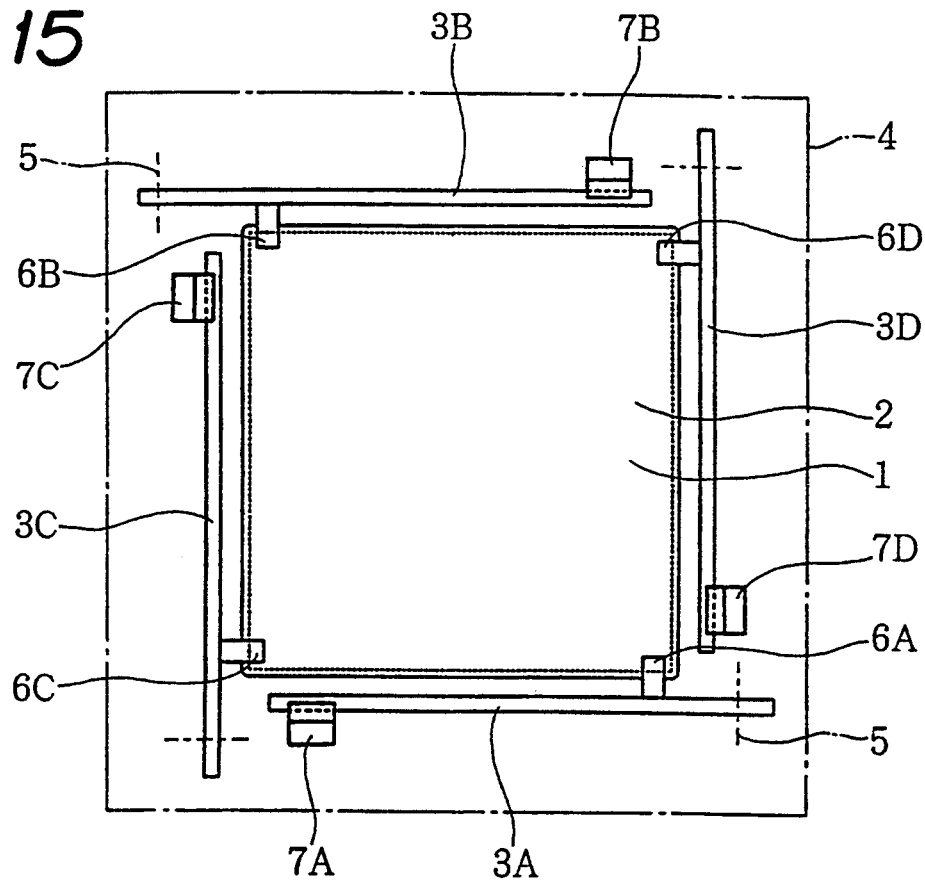
FIG. 15 is a plan view of an important portion of an electric part socket of FIG. 14 but according to a modified embodiment of the present invention.

In FIGS. 14 and 15, the numeral 1 denotes an electric part. As a typical example of the electric part, FIGS. 14 and 15 show an LGA type IC including an electric part body 2 and a plurality of electric conductive pads arranged on a lower surface of the electric part body 2.

The reference symbols 3A and 3B denote pressing levers, respectively. As shown in FIG. 14, the pressing levers 3A and 3B are provided on two opposite sides of the electric part body 2 such that the pressing levers 3A and 3B are capable of pivoting upwardly and downwardly along the opposite sides. For example, one end of each of the pressing levers 3A and 3B is pivotably supported on a socket body 4 for pivoting about axis 5 each pressing lever extends along a side surface of the electric part body 2 from the axis to a free end.

Preferably, one end of the pressing lever 3A is supported at one end of the socket body 4 through one of the axes 5 such that the pressing lever 3A can be pivoted upwardly and downwardly about the axis 5, while one end of the pressing lever 3B is supported at the other end of the socket body 4 through the other axis 5 such that the pressing lever 3B can be pivoted upwardly and downwardly about the other axis 5. The pressing levers 3A and 3B extend in opposite directions with respect to each other from their respective pivot points (i.e. axes 5), respectively.

Latches 6A and 6B are respective mounted on the levers 3A and 3B and are brought into engagement with edge portions of the electric part body 2, respectively, when the pressing levers 3A and 3B are pivoted downwardly, so as to apply a press-down force to the electric part body 2. In the example of FIGS. 14 and 15, the latches 6A and 6B are integral with the pressing levers 3A and 3B, respectively. As later described, however, the latches 6A and 6B may be formed as separate members from the pressing levers 3A and 3B, respectively, and supported on the socket body 4 such that the latches 6A and 6B can be pivoted upwardly and downwardly. In this case, the latches are brought into engagement with the edge portions of the electric part body 2, respectively, when the pressing levers 3A and 3B are pivoted downwardly, so as to press the electric part body 2 down.

Preferably, the latches 6A and 6B are provided in the vicinity of the pivot points of the pressing levers 3A and 3B, respectively, so that when the pressing lever 3A is pivoted downwardly, the latch 6A is brought into engagement with one corner portion on a diagonal line of the electric part body 2, and when the pressing lever 3B is pivoted downwardly, the latch 6B is brought into engagement with the other corner portion on the diagonal line of the electric part body 2, thereby applying a downward force to the electric part body 2.

The press down force is applied by the latches 6A and 6B at locations on the electric part body offset from the elongated pressing levers 3A and 3B and 6B, respectively. As a result, a vertical parallel shifting of the electric part body is performed in a well-balanced manner.

Lock members 7A and 7B are pivotably mounted on the socket body 4 such that when the pressing levers 3A and 3B are pivoted downwardly, the lock members 7A and 7B are brought into engagement with the free ends of the pressing levers 3A and 3B, respectively. Although not shown, the lock members 7A and 7B may be brought into engagement with a member capable of contributing to the downward pressing of the pressing levers 3A and 3B, such as for example a first actuator 24 as will be described later.

Due to engagement of the lock members 7A and 7B, the pressing levers 3a and 3B are prevented from being pivoted upwardly and downwardly, and the engaging condition of the latches 6A and 6B with the edge portions of the electric part body 2 and the pressing-down condition of the electric part body 2 are maintained. Furthermore, the terminals on a lower surface of the electric part body 2 are pressed against the contacts on the socket body 4, thereby maintaining the contacting condition therebetween.

The pressing levers 3A and 3B are resiliently urged upwardly by springs, and when the lock members 7A and 7B are unlocked, the pressing levers 3A and 3B are automatically pivoted upwardly by upwardly directed pressing forces of the springs. When the pressing levers 3A and 3B are pivoted upwardly, the latches 6A and 6B are moved outside of the electric part receiving portion 8.

FIG. 15 shows another example in which additional pressing levers 3C and 3D are provided at the two remaining opposite sides of the electric part body 2. The pressing levers 3C and 3D and the lock members 7C and 7D are exactly the same as the pressing levers 3A and 3B and the lock members 7A and 7B mentioned above.

In the example of FIG. 15, the pressing levers 3A to 3D are provided at the four sides of the electric part body 2 such that the pressing levers 3A and 3D can be pivoted upwardly and downwardly along the four sides. The latches 6A to 6D are brought into engagement with the four edges of the electric part body 2, thus allowing the press-down force to be applied uniformly to the electric part body 2.

Next, concrete examples, which include the basic features of the present invention described with reference is FIGS. 14 and 15, will be described with reference to FIGS. 1 to 13. The socket body 4 is formed of an electrically-insulative material and has a generally square shape in plan view. The socket body 4 has a receiving portion for receiving the electric part body 2 at an upper surface thereof. A number of contacts 9 are arranged on a bottom surface of the receiving portion 8.

Figure 10:
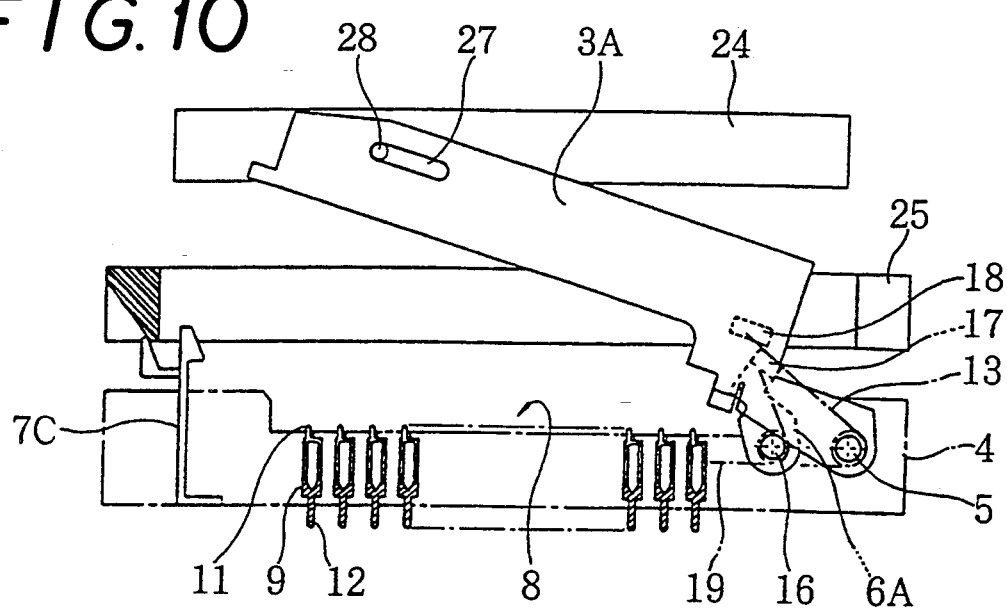
FIG. 10 is a schematic cross-sectional view of the electric part socket in which the actuator is in an uppermost position and the electric part is not yet placed on the socket.
Figure 11:
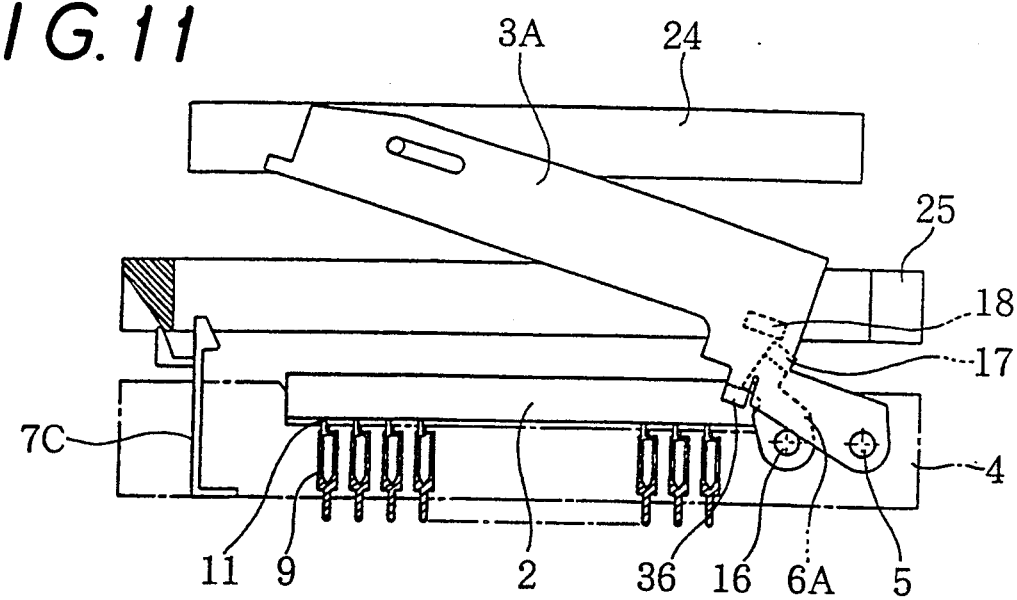
FIG. 11 is a schematic cross-sectional view of the electric part socket of FIG. 10, but in which the electric part is placed on the socket.

As shown in, for example, FIG. 10, the contacts 9 have movable contacting members 11, respectively, which are capable of being resiliently moved upwardly and downwardly. Upper ends of the contacting members 11 project upwardly from the bottom surface of the receiving portion 8 so as to correspond to the terminals formed of a number of electrically-conductive pads arranged on the lower surface of the electric part body 2. The movable contacting members are resiliently urged upwardly such that when the upper ends of the movable contacting members 11 are pressed against by the terminals, the movable contacting members 11 are moved downwardly against a resilient urging force, and when the pressing force is removed, the movable contacting members 11 are moved upwardly by the resilient urging force.

For example, the movable contacting members 11 can be resiliently urged upwardly by springs mounted in sleeves, respectively, as in known contacts. Alternatively, each contact may be of a known construction in which the contact is formed by bending an elongated element which can be compressed downwardly and restored upwardly.

Each contact 9 has a male terminal 12 projecting from a stationary contacting portion such as a sleeve embedded in the socket body 4 and adapted to contact the corresponding movable contacting member 11. The male terminal 12 of each contact 9 projects downwardly from the lower surface of the socket body 4 so as to contact a wiring board or the like.

The four pressing levers 3A, 3B, 3C and 3D are arranged along the four sides of the electric part body 2, in other words, along the four sides of the electric part receiving portion 8. The pressing levers 3A to 3D are each supported at one end thereof on the socket body 4 by a pin 5 such that the pressing levers 3A to 3D can be pivoted upwardly and downwardly about the pin 5. Each of the pressing levers 3A to 3D extends along a respective side of the electric part body 2 from the pivot point at a first end thereof to a free end at a second end thereof.

The two opposite pressing levers 3A and 3B will now be described. One of the pressing levers, e.g., the pressing lever 3A, is pivotably supported at one end of the socket body 4, and the other pressing lever 3B is pivotably supported at the other end of the socket body 4. The pressing levers 3A and 3B extend in opposite directions with respect to each other from their pivot points, respectively. The two remaining opposite pressing levers 3C and 3D also extend in opposite directions with respect to each other from their pivot points, respectively. A resilient urging force is imposed on each of the pressing levers 3A to 3D at a position near its pivot point, so that an upward pivoting force is normally applied to the pressing levers 3A to 3D.

The latches 6A to 6D are provided near the pivot points of the pressing levers 3A to 3D, respectively, and the lock members 7A to 7D are provided near the free ends of the pressing levers 3A to 3D, respectively. The latches 6A to 6D are supported on the socket body 4 by pins 16 adjacent to the pins 5, respectively, such that the latches 6A to 6D can be pivoted upwardly and downwardly. Each of the latches 6A to 6D is provided at a distal end thereof with a retaining claw element 17 bent towards the receiving portion 8. As shown in FIG. 10, a forked spring 19 is coupled to each of the latches 6A to 6D at a pivot point thereof, so as to resiliently urge each of the latches to pivot upwardly.

Figure 7:
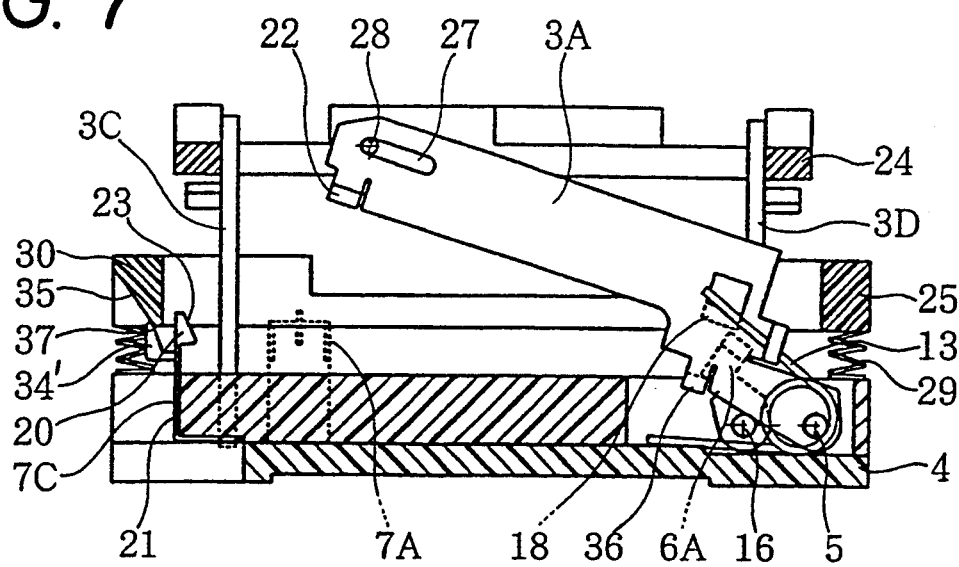
FIG. 7 is a cross-sectional view of the electric part socket taken along line 7—7 of FIG. 6, in which the actuator is in the uppermost position.

As shown, for example, in FIG. 7, a lower surface of a distal end portion of each of the latches 6A to 6D is supported by a push-up element 36 projecting from each of the pressing levers 3A to 3D so as to pivot each of the latches 6A to 6D upwardly, and push-down elements 18 are provided on the levers 3A to 3D to push-down on the latches 6A to 6D. Accordingly, each of the latches 6A to 6D is pivoted downwardly and upwardly by the push-down element 18 and the push-up element 36, respectively, in accordance with the movement of each of the pressing levers 3A to 3D. Either the forked spring 19 or the push-up element 18 may be selected for use.

Each of the press-down elements 18 projects from one of the pressing levers 3A–3D and is positioned adjacent an upper part of each of the latches 6A to 6D, i.e., adjacent an upper part of the retaining claw element 17. As shown, for example, in FIGS. 10 and 11, when each of the pressing levers 3A to 3D is pivoted upwardly by the resiliency of each spring 13, each of the press-down elements 18 removes the pressure of each of the latches 6A to 6D, and when each of the pressing levers 3A to 3D is pivoted downwardly against the resiliency of each spring 13, the retaining claw element 17 of each of the latches 6A to 6D is pressed down to pivot each of the latches 6A to 6D downwardly. In accordance with this downward pivoting movement of each of the latches 6A to 6D, the retaining claw element 17 is brought into engagement with the edge portion of the electric part body 2, thereby applying a press-down force to the electric part body 2.

The press-down force applied to the free end of each of the pressing levers 3A to 3D is amplified by the leverage of each lever and then applied to each of the latches 6A to 6D.

Although there has been described an example in which the latches 6A to 6D are formed as separate parts from the pressing levers 3A to 3D, respectively, and the electric part body 2 is indirectly pushed down, the latches 6A to 6D can integrally project from the pressing levers 3A to 3D, respectively, as shown in FIGS. 14 and 15.

Preferably, the latches 6A to 6D are arranged in such a manner as to be engageable with the respective corner portions of the electric part body 2, respectively, so as to apply a press-down force to the electric part body 2. For example, if attention is paid to the above-mentioned two opposite pressing levers 3A and 3B, by virtue of the arrangement that the two pressing levers 3A and 3B are pivotally supported on the opposite sides of the socket body 4 and extend in opposite directions with respect to each other from the pivot points, respectively, and the latches 6A and 6B are arranged near the pivot points, respectively, the latches 6A and 6B are respectively engageable with the edge portions of the electric part body 2 at locations offset from the elongated pressing levers 3A and 3B. The latches 6C and 6D are also arranged in the same way. Owing to this arrangement, the latches 6A to 6D are brought into engagement with the edge portions of the electric part body 2 near the corner portions thereof, so as to apply a pressing force to the electric part body 2.

Owing to the above-mentioned arrangement of the latches 6A to 6D, the latches can be brought into engagement with the edge portions of the electric part body at the same time, and also can shift the electric part body upwardly and downwardly in parallel and such that it is well-balanced. As a result, proper contacting conditions can be provided between the individual contacts and the corresponding individual terminals.

As a means for preventing the upward pivoting of each of the pressing levers 3A to 3D, the lock members 7A to 7D are provided on the socket body 4. The lock members 7A to 7D are engageable with the free end portions of the pressing levers 3A to 3D, respectively, or are engageable with a first actuator 24 as will be described later, so as to prevent the pressing levers from pivoting upwardly.

As one concrete example, the lock members 7A to 7D include upwardly extending portions 21 mounted to the socket body 4, and hook portions 20 respectively provided on the upper ends of the upwardly extending portions 21. The hook portions 20 can be shifted inwardly and outwardly due to a resiliency of the upwardly extending portions 21.

On the other hand, the free ends of the pressing levers 3A to 3D are provided with retaining claw elements 22 respectively projecting sidewardly, such that the retaining claw elements 22 are vertically aligned with the hook portions 20, respectively.

When the pressing levers 3A to 3D are pivoted downwardly, the retaining claw elements 22 are brought into abutment with slanted surfaces 23 formed on top surfaces of the hook portions 20, respectively, so as to displace the hooks 20 against the resiliency of the raised portions 21 while sliding along the slanted surfaces 23. When the retaining claw elements 22 pass the slanted surfaces, respectively, the hooks 20 are restored inwardly and brought into engagement with the retaining claw elements 22, respectively.

As a result, the pressing levers 3A to 3D are prevented from being pivoted upwardly, the pressing down condition of the electric part achieved by the latches 6A to 6D is maintained, and the pressure contacting condition between each contact 9 and each electric part terminal can be maintained.

The springs 13 normally impose an upwardly directed force on the pressing levers 3A to 3D. Therefore, when the lock members 7A to 7D are unlocked, the pressing levers 3A to 3D as well as the latches 6A to 6D are automatically pivoted upwardly to release the pressed down condition of the electric part body 2 by the latches 6A to 6D, thereby allowing the electric part to be inserted or removed. At this time, the latches 6A to 6D are moved outside the receiving portion 8.

As an operation means for pressing down the pressing levers 3A to 3D simultaneously, there is provided a first actuator 24, and as an operation means for removing the engagements of the lock members 7A to 7D, there is provided a second actuator 25.

The first and second actuators 24 and 25 are formed of square frames, respectively, and are disposed at an upper portion of the socket body 4 such that the first and second actuators 24 and 25 can be moved upwardly and downwardly. The first and second actuators 24 and 25 are arranged such that the second actuator 25 is located inwardly of the first actuator 24, or such that the first actuator 24 is located inwardly of the second actuator 25. The receiving portion 8 is disposed right under and opposite to a window defined by frame elements of the first and second actuators 24 and 25.

More specifically, the frames constituting the first and second actuators 24 and 25 surround the receiving portion 8, and the electric part can be inserted and removed from the receiving portion 8 through the window.

Frame elements 26 constituting the first actuator 24 are connected to the pressing levers 3A to 3D, respectively, through loosely supporting connections (pivot points).

For example, the free end of each of the pressing levers 3A to 3D is provided with a guide hole 27 which is formed of an elongated slot directing in the longitudinal direction of the pressing lever. A guide pin 28 projecting from an inner surface of each frame element 26 is slidably fitted in the guide hole 27.

As mentioned above, when the pressing levers 3A to 3D are pivoted upwardly by the springs 13, respectively, the force of the springs 13 is applied to the first actuator 24 through the pivot points (loosely supporting connections). As a result, when the first actuator 24 is moved upwardly in connection with the upward pivoting motion of the pressing levers 3A to 3D, the guide pins 28 are moved from inner ends toward outer ends of the guide holes 27, respectively. When the guide pins 28 are brought into abutment with the outer ends of the guide holes 27, respectively, the pressing levers 3A to 3D are prevented from being pivoted upwardly and the first actuator 24 is prevented from being moved upwardly.

Figure 1:
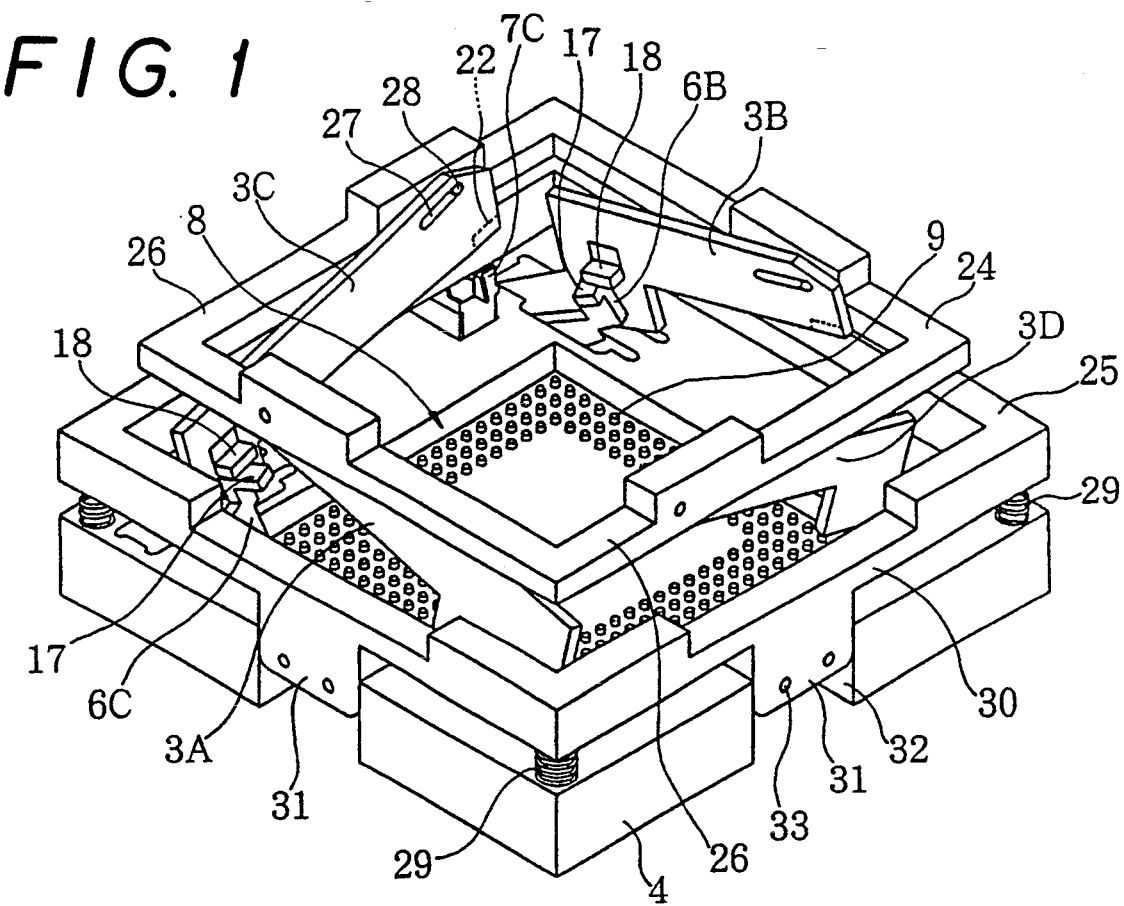
FIG. 1 is a perspective view of an electric part socket according to one embodiment of the present invention, in which an actuator is in an uppermost position.
Figure 2:
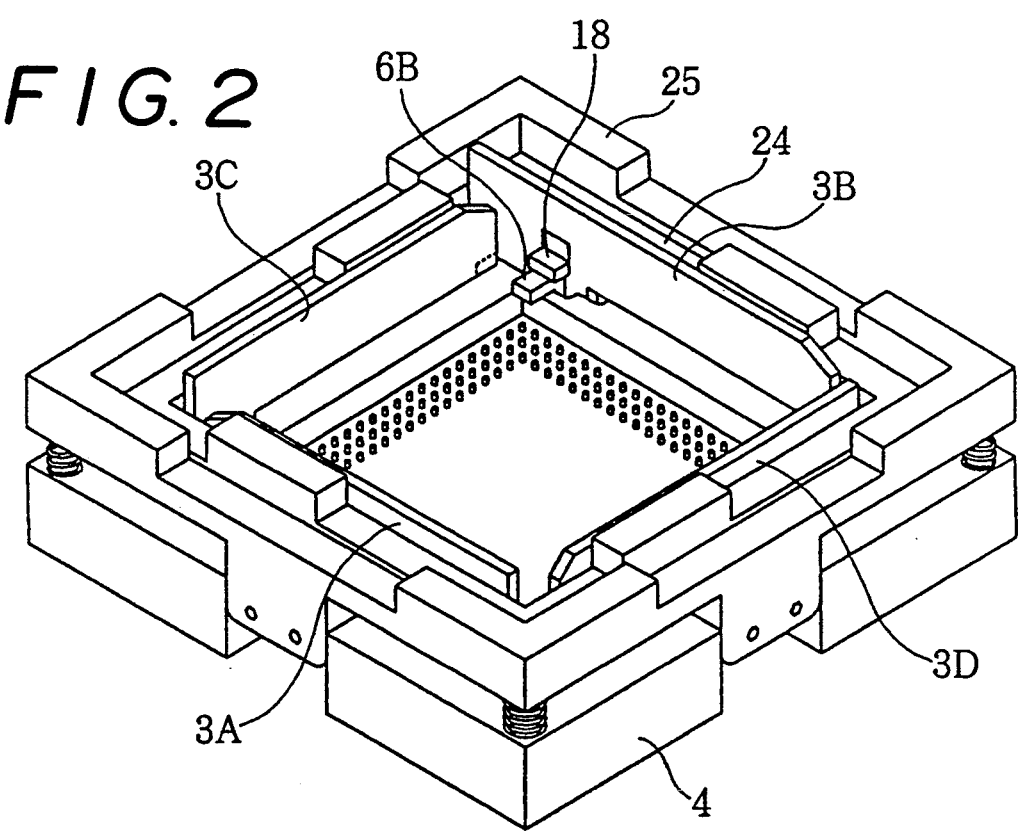
FIG. 2 is likewise a perspective view of the electric part socket of FIG. 1 but in which the actuator is in a lowermost position.
Figure 8:
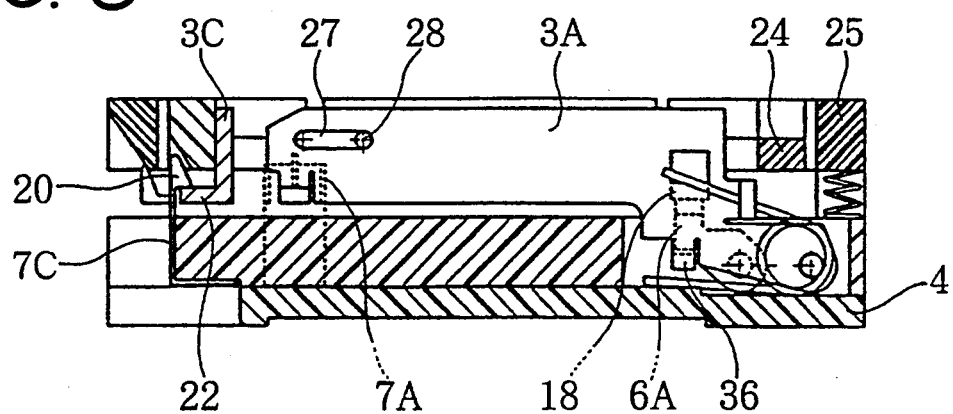
FIG. 8 is likewise a cross-sectional view of the electric part socket taken along line 7—7 of FIG. 6, in which the actuator is in the lowermost position.
Figure 9:
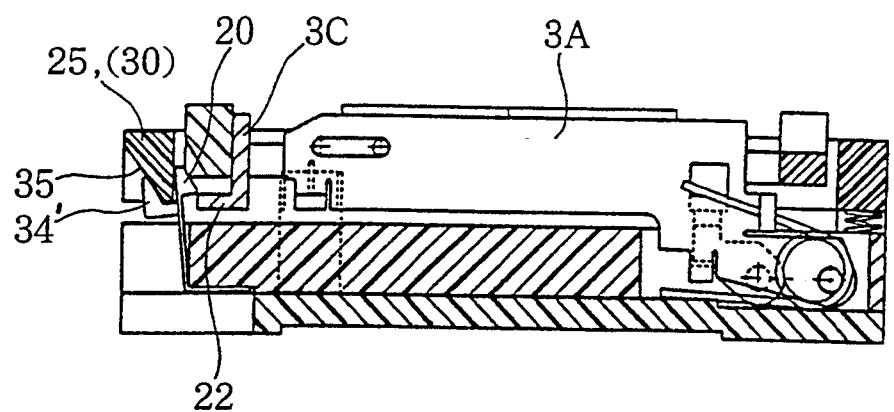
FIG. 9 is likewise a cross-sectional view of the electric part socket taken along line 7—7 of FIG. 6, in which a lock member is in the course of being unlocked.
Figure 12:
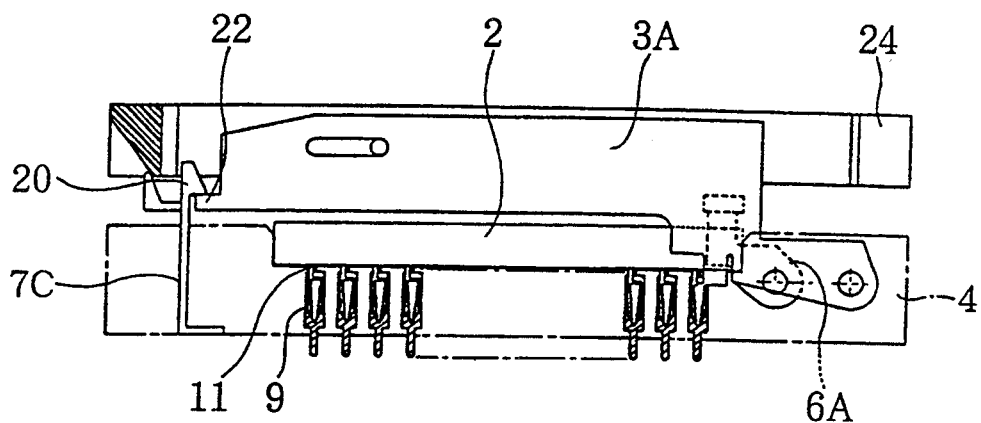
FIG. 12 is a schematic cross-sectional view of the electric part socket of FIG. 11, but in which a first actuator is pressed down and as a result, the electric part is pressed down by the first actuator.
Figure 13:
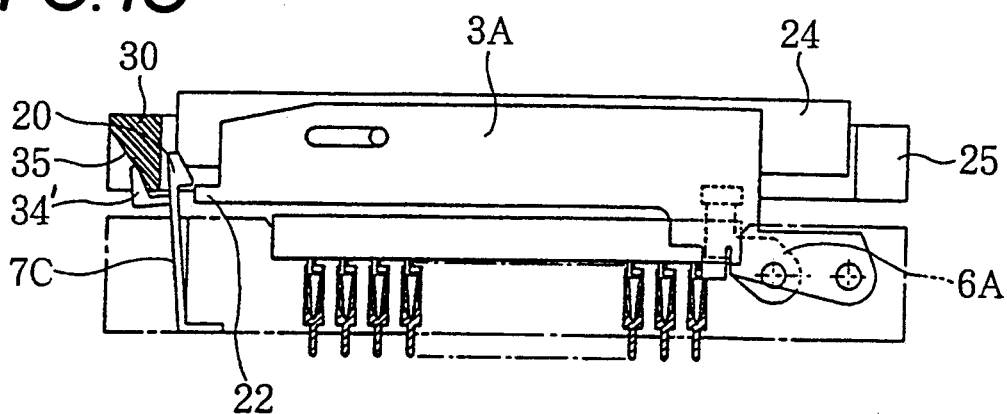
FIG. 13 is a schematic cross-sectional view of the electric part socket of FIG. 12, but in which a second actuator is pressed down and as a result, the lock member is unlocked by the second actuator.

As shown, for example, in FIGS. 1, 8 and 12, when a press-down force is applied to the first actuator 24 by an automatic machine or by an operator's finger, the first actuator 24 is moved downwardly and causes the guide pins 28 to move from the outer ends toward the inner ends of the guide holes 27, respectively. In connection with this movement, the pressing levers 3A to 3D are caused to pivot downwardly. When, for example, the lower surface of the electric part body 2 is brought into abutment with the upper surface of the socket body 4, or when the guide pins 28 are brought into abutment with the inner ends of the guide holes 27, respectively, the first actuator 24 is prevented from being moved downwardly and the pressing levers 3A to 3D are prevented from being pivoted downwardly.

At this position, engagement with the lock members 7A to 7D is achieved. As a consequence, the electric part body 2 is held down by the latches 6A to 6D, and the above contacting condition is maintained. Of course, it may be designed such that after the pressing levers 3A to 3D are slightly pivoted downwardly from the engaging position with the lock members 7A to 7D, the pressing levers 3A to 3D are restored by the springs to achieve the engagement with the lock members.

As described above, by means of the connection between the pressing levers 3A to 3D and the first actuator 24 through the loosely supporting connections, the amount of movement is limited and the uppermost position of the first actuator 24 is normally held in a constant position so as to be ready for the next pushing down operation.

As previously described, the pressing levers 3A and 3B are arranged such that their pivot points and free ends are opposite to each other, and the free ends of the pressing levers 3A and 3B are connected to the first actuator 24 through the loosely supporting connections. The arrangement being such that when the pressing lever 3A is pivoted clockwise upwardly, the other pressing lever 3B is pivoted counterclockwise upwardly. As a consequence, when the guide pins 28 are brought into abutment with the outer ends of the guide holes 27, the pressing levers 3A and 3B and the first actuator 24 are prevented from further movement, thereby positively establishing the uppermost positions.

Furthermore, the second actuator 25 is resiliently held by a coil spring 29 interposed between the socket body 4 and the second actuator 25. As a result, an upwardly directed force is applied to the second actuator 25. The upward and downward movement is guided by slidably fitting a guide element 31, which extends downwardly from a frame element 30 of the second actuator 25, into a guide groove 32 formed in a side surface of the socket body 4. By slidably fitting a guide pin 33 projecting from an inner surface of the guide element 31 into a guide groove 34 formed in an inner surface of the guide groove 32, the second actuator 25 is allowed to move upwardly and downwardly within a range of the guide groove 34.

As described above, when the first actuator 24 is pressed down from the uppermost position as shown, for example, in FIGS. 1 and 7, the pressing levers 3A to 3D are simultaneously pivoted downwardly and press the latches 6A to 6D, respectively, to cause the latches to engage with the edge portions of the electric part body 2, so that the electric part body 2 is pressed downwardly. As a consequence, the terminals arranged on the lower surface of the electric part body 2 are brought into contact with the corresponding contacts 9 under pressure. The pressing levers 3A to 3D are brought into engagement with the lock members 7A to 7D in the vicinity of the lowermost position, thereby maintaining the pressure contacting condition.

Figure 3:
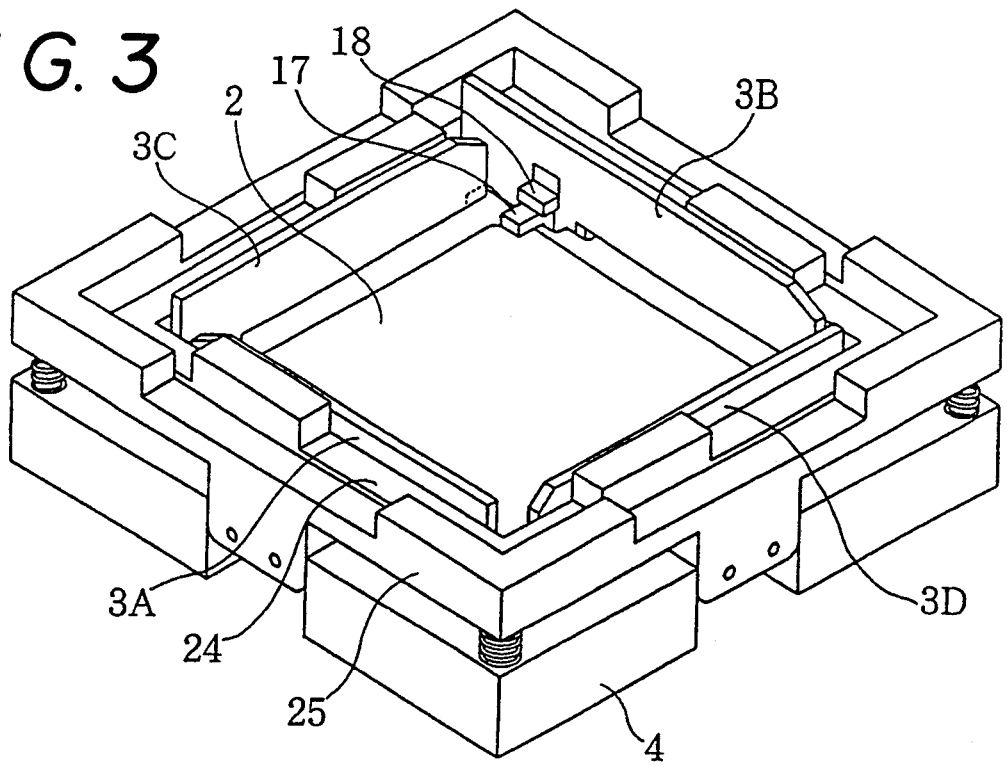
FIG. 3 is a perspective view of the electric part socket of FIG. 2 but with an electric part placed thereon.
Figure 4:
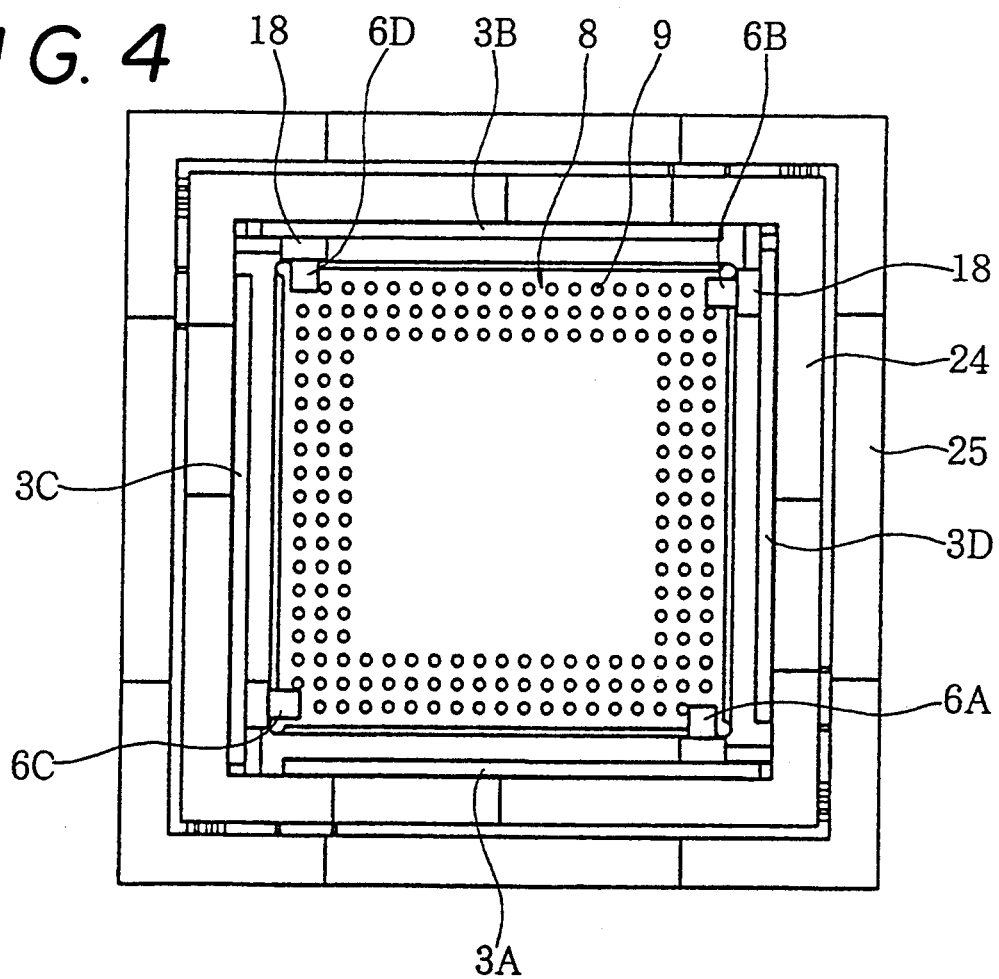
FIG. 4 is a plan view of the electric part socket of FIG. 1.
Figure 5:
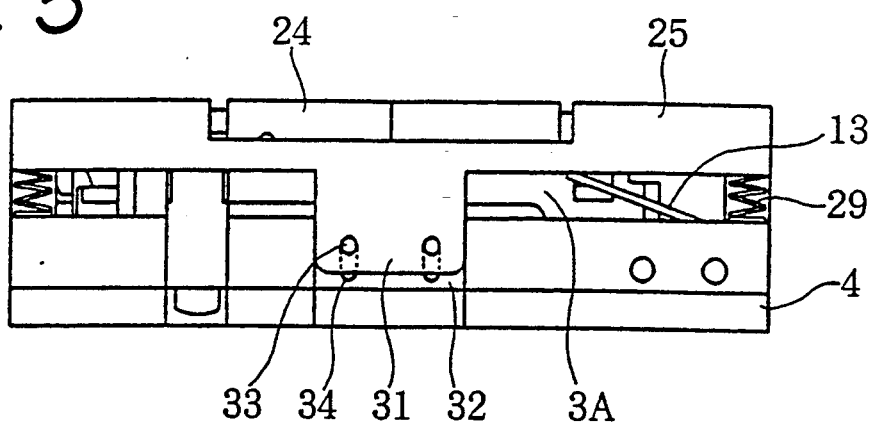
FIG. 5 is a side view of the electric part socket of FIG. 1.
Figure 6:
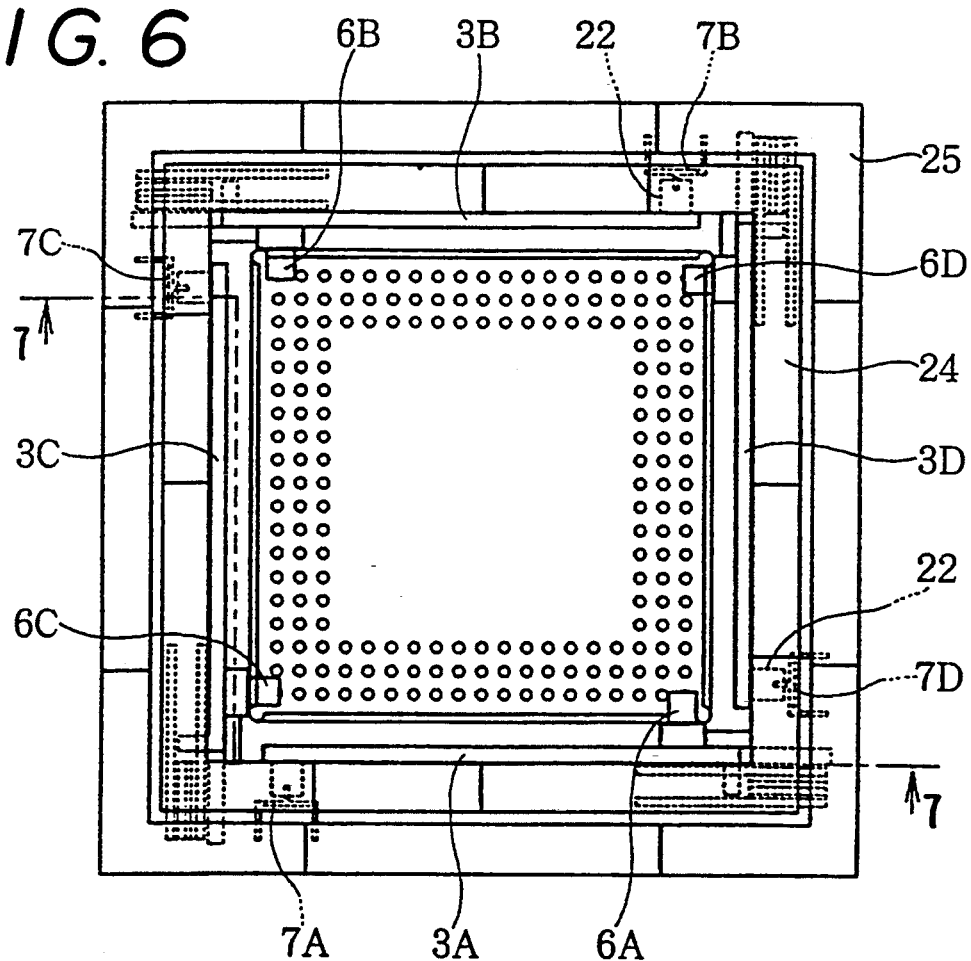
FIG. 6 is a plan view of the electric part socket of FIG. 2.

Next, as shown, for example, in FIGS. 3, 8 and 12, in the condition where the pressing levers 3A and 3D are locked (contacting condition maintaining state), when the second actuator 25 is moved downwardly against the spring 29, the frame elements 30 (as shown, for example, in FIGS. 9 and 13) displace the hook portions 20 of the lock members 7A to 7D outwardly. As a result, the engagement between each hook portion 20 and each retaining claw element 22 is removed, and the pressing levers 3A to 3D are pivoted upwardly by the resilient force of the spring 13, and at the same time the first actuator 24 is moved upwardly.

When the press-down force of the second actuator 25 is removed, the second actuator 25 is moved upwardly by the force of the spring 29 into a standby position to await the next press-down operation, as shown, for example, in FIGS. 1 and 7. In this condition, the electric part can be removed from the socket body.

As a means for unlocking the lock members 7A to 7D when the second actuator 25 is pressed downwardly, for example, a pressure bearing element 34' of a cantilever construction projects rearwardly of the hook portion 20, and a slanted surface 35 corresponding to the pressure bearing element 34' is formed on a lower surface of the frame element 30 of the second actuator 25. Thus, when the second actuator 25 is pressed down, the slanted surface 35 presses an upwardly directed projection 37 on a distal end of the pressure bearing element 34' outwardly to raise the hook portion 20 upwardly so as to displace the same outwardly against the resiliency of the raised portion 21, thereby removing the engaging condition with the pressing levers 3A to 3D.

As described in the foregoing, the pressing down of the electric part and its removal can be performed sequentially by operation of the first and second actuators 24 and 25.

The present invention is not limited to the above embodiments, and many modifications can be made without departing from the spirit and scope of the present invention. For example, instead of using the first and second actuators, a press-down operation portion may be provided for each pressing lever in order to directly press down the electric part.

What is claimed is:

1. In an electric part socket which includes a socket body having a plurality of contacts and in which an electric part having a body and a plurality of terminals, is mountable in the socket body such that the terminals are brought into contact with the contacts, respectively, when a press-down force is applied to the body of the electric part, an apparatus constitutes a means for pressing down and maintaining the electric part body in a contacting position in the socket body such that the terminals of the electric part are in contact with the contacts of the socket, and said apparatus comprises: pressing levers pivotably mounted on each of at least two opposite sides of the socket body for pivotal movement upwardly and downwardly along said opposite sides between upper positions and lower positions, respectively; latches corresponding to said pressing levers and being respectively engageable with edge portions of the electric part body when said pressing levers are pivoted downwardly, so as to press the electric part body down into the contacting position; lock members positioned in the socket body corresponding to said pressing levers for preventing said pressing levers from being pivoted upwardly from their lower positions and thereby maintaining said latches in positions in which they engage with and press down on the electric part body; and an actuator, connected to said pressing levers for movement upwardly and downwardly relative to the socket body, for pressing said pressing levers downwardly when said actuator is moved downwardly.

2. In an electric part socket which includes a socket body having a plurality of contacts and in which an electric part, having a body and a plurality of terminals, is mountable in the socket body such that the terminals are brought into contact with the contacts, respectively, when a press-down force is applied to the body of the electric part, an apparatus constitutes a means for pressing down and maintaining the electric pert body in a contacting position in the socket body such that the terminals of the electric part are in contact with the contacts of the socket, and said apparatus comprises: pressing levers pivotably mounted on each of at least two opposite sides of the socket body for pivotal movement upwardly and downwardly along said opposite sides between upper positions and lower positions, respectively; latches corresponding to said praising levers and being respectively engageable with edge portions of the electric part body when said pressing levers are pivoted downwardly, so as to press the electric part body down into the contacting position; lock members positioned in said socket body corresponding to said pressing levers for preventing said pressing levers from being pivoted upwardly from their lower positions and thereby maintaining said latches in positions in which they engage with and press down on the electric part body; a first actuator, connected to said pressings levers for movement upwardly and downwardly relative to the socket body, for pressing said pressing levers downwardly when said first actuator is moved downwardly; and a second actuator, mounted on an upper part of said socket body for movement upwardly and downwardly relative to said socket body, for moving maid lock members to unlock positions, respectively.

3. An apparatus for use in an electric part socket as claimed in claim 1 or 2, wherein
said latches are integral with said pressing levers, respectively.

4. An apparatus for use in an electric part socket as claimed in claim 1 or 2, wherein
said latches are pivotably mounted on the socket body, said latches being pivoted downwardly when pressed down by said pressing levers, respectively.

5. An apparatus for use in an electric part socket as claimed in claim 1 or 2, wherein
said levers are provided on four sides of the socket body and are pivotable upwardly and downwardly along said four sides, said latches being pivoted downwardly when pressed down by said pressing levers, respectively.

6. An apparatus for use in an electric part socket as claimed in claim 1 or 2, wherein
one of maid pressing levers is pivotably supported at a basal end thereof on one end side of the socket body, and an opposing one of said pressing levers is pivotably supported at a basal end thereof on the other end side of the socket body, said pressing levers extending in opposite directions with respect to each other from said basal ends, respectively, and being engageable with said lock member, said latches being engageable with said electric part body at locations offset from said pressing lever.

7. An apparatus for use in an electric part socket as claimed in claim 1, wherein
free ends of said pressing levers are connected to said actuator by pin and slot connections, respectively.

8. An apparatus for use in an electric part socket as claimed in claim 2, wherein
free ends of said pressing levers are connected to said first actuator by pin and slot connections, respectively.

9. In an electric part socket which includes a socket body having a plurality of contacts and in which an electric part, having a body end a plurality of terminals, is mountable in the socket such that the terminals are brought into contact with the contacts, respectively, when a press-down force is applied to the body of the electric part, an apparatus constitutes a means for pressing down and maintaining the electric part body in a contacting position in the socket body such that the terminals of the electric part are in contact with the contacts of the socket, and said apparatus comprises: pressing levers pivotably mounted on each of at least two opposite sides of the socket body for pivotal movement upwardly and downwardly along said opposite sides between upper positions and lower positions, respectively, latches corresponding to said pressing levers end being respectively engageable with edge portions of the electric part body when said pressing levers are pivoted downwardly, so as to press the electric part body down into the contacting position; lock members positioned in said socket body corresponding to said pressing levers for preventing said pressing levers from being pivoted upwardly from their lower positions and thereby maintaining said latches in position in which they engage with and press down the electric part body, and wherein said latches are pivotably mounted on the socket body, said latches being pivoted downwardly when pressed down by said pressing levers, respectively.

10. In an electric part socket which includes a socket body having a plurality of contacts and in which an electric part, having a body and a plurality of terminals, is mountable in the socket body such that the terminals are brought into contact with the contacts, respectively, when a press-down force is applied to the body of the electric part, an apparatus constitutes a means for pressing down and maintaining the electric part body in a contacting position in the socket by such that the terminals of the electric part are in contact with the contacts of the socket, and said apparatus comprises: pressing levers pivotably mounted on each of at least two opposite sides of the socket body for pivotal movement upwardly and downwardly along said opposite aides between upper positions and lower positions, respectively; latches corresponding to said pressing levers and being respectively engageable with edge portions of the electric part body when said pressing levers are pivoted downwardly, so as to press the electric part body down into the contacting position; lock members positioned in said socket body corresponding to said pressing levers for preventing said pressing levers from being pivoted upwardly from their lower positions and thereby maintaining said latches in positions in which they engage which and press down on the electric part body; and wherein said levers are provided on four sites of the socket body and are pivotable upwardly and downwardly along said four sides, said latches being pivoted downwardly when pressed down by said pressing levers, respectively.

11. An electric part socket apparatus, comprising:
a socket body having an electric part receiving portion for receiving an electric part which includes a body and terminals mounted to the body, said electric part receiving portion having contacts hereon adapted to contact with the terminals of the electric part when the electric part is positioned in the electric part receiving portion of said socket body;

a pair of elongated pressing levers pivotably mounted to said socket body and being on opposing sides of said electric part receiving portion, each of said elongated pressing levers having a first end pivotably mounted to said socket body and a second free end and being pivotable between an upper position and a lower position relative to said socket body;

a pair or latches, each of which is movable between a pressing position in which it presses down against the electric part when the electric part is disposed in said electric receiving portion, and a non-pressing position spaced from said pressing position, said latches being operatively coupled with sale pressing levers, respectively, so as to be moved to said pressing positions when said pressing levers are moved into their lower positions, respectively;

a pair of lock members operably coupled with said pressing levers, respectively, so as to prevent said pressing levers from pivoting from said lower positions toward said upper positions, in order to maintain said latches in said pressing positions; and a first actuator means, separably coupled to said pressing levers and movable upwardly and downwardly, for pressing said pressing levers downwardly into said lower positions thereof when said first actuator means is moved downwardly.

12. An electric part socket apparatus as recited in claim 11, further comprising a second actuator means, movably mounted to said socket body for movement upwardly and downwardly, for moving said lock members to release said pressing levers from said lower positions and allowing said pressing levers to move upwardly to said upper positions.

13. An electric part socket apparatus as recited in claim 12, further comprising first biasing means for biasing said pressing levers toward said upper positions; and second biasing means for biasing said second actuator means upwardly.

14. An electric part socket apparatus as recited in claim 11, further comprising first biasing means for biasing said pressing levers toward said upper positions.

15. An electric part socket apparatus as recited in claim 11, wherein said latches are integral with said pressing levers, respectively, and extend inwardly toward said electric part receiving portion.

16. An electric part socket apparatus as recited in claim 11, wherein said latches are pivotably mounted to said socket body for pivotable movement upwardly and downwardly.

17. An electric part socket apparatus as recited in claim 11, further comprising a pair of additional elongated pressing levers pivotably mounted to said socket body and being on opposing sides of said electric part receiving portion, each of said additional elongated pressing levers having a first end pivotably mounted to said socket body and a second free end and being pivotable between an upper position and a lower position relative to said socket body;

a pair of additional latches, each of which is movable between a pressing position in which presses down against the electric part when the electric part is disposed in said electric part receiving portion, and a non-pressing position spaced from said pressing position, said additional latches being operatively coupled with said additional pressing levers, respectively, so as to be moved to said pressing positions when said additional pressing levers are moved into their lower positions, respectively;

a pair of additional lock member operably coupled with said additional pressing levers, respectively, so as to prevent said additional pressing levers from pivoting from said lower positions toward said upper positions, in order to maintain said additional latches in said pressing positions; and wherein said first actuator means is operably coupled to said additional pressing levers and is movable upwardly and downwardly for pressing said additional pressing levers downwardly into said lower positions thereof when said first actuator means is moved downwardly.

18. An electric part socket apparatus as recited in claim 11, wherein said pressing levers are mounted on said socket body such that a direction from said first end to said second end of one of said pressing levers is opposite to a direction from said first end to said second end of the other of said pressing levers.

19. An electric part socket apparatus as recited in claim 11, wherein said second ends of said pressing levers are connected to said first actuator means by pin and slot connections, respectively.

* * * * *